(12) United States Patent
Wu et al.

(10) Patent No.: US 6,756,627 B1
(45) Date of Patent: *Jun. 29, 2004

(54) CONTAINER CAPACITOR

(75) Inventors: Zhiquiang Wu, Meridian, ID (US); Li Li, Meridian, ID (US); Kunal Parekh, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/033,290

(22) Filed: Mar. 2, 1998

Related U.S. Application Data

(62) Division of application No. 08/818,597, filed on Mar. 14, 1997, now Pat. No. 5,786,250.

(51) Int. Cl.[7] .................. H01L 27/108; H01L 29/76; H01L 29/94; H01L 31/119
(52) U.S. Cl. ................................ 257/306; 257/309
(58) Field of Search .................. 257/306, 298, 257/309; 438/398, 253–255

(56) References Cited

U.S. PATENT DOCUMENTS

| | | | |
|---|---|---|---|
| 5,082,797 A | | 1/1992 | Chan et al. ............... 438/255 |
| 5,101,251 A | * | 3/1992 | Wakamiya et al. ......... 257/296 |
| 5,290,729 A | * | 3/1994 | Hayashide et al. ......... 438/255 |
| 5,298,792 A | | 3/1994 | Manning ................... 257/758 |
| 5,340,774 A | | 8/1994 | Yen ........................... 437/240 |
| 5,362,666 A | * | 11/1994 | Dennison ................... 438/396 |
| 5,391,511 A | * | 2/1995 | Doan et al. ................. 438/396 |
| 5,392,189 A | | 2/1995 | Fazan et al. ................ 361/305 |
| 5,401,681 A | | 3/1995 | Dennison ................... 257/296 |
| 5,529,946 A | * | 6/1996 | Hong ......................... 438/253 |
| 5,605,857 A | | 2/1997 | Jost et al. ................... 438/253 |
| 5,940,702 A | * | 8/1999 | Sakao ........................ 438/254 |

FOREIGN PATENT DOCUMENTS

| | | | | |
|---|---|---|---|---|
| JP | 2-219264 | * | 8/1990 | ................ 257/306 |

* cited by examiner

*Primary Examiner*—Thien F Tran
(74) *Attorney, Agent, or Firm*—Workman Nydegger

(57) ABSTRACT

A method of the present invention forms a vertically oriented structure connected with a source/drain region through open space. In one embodiment of the method wherein a capacitor storage node is formed, the open space is located between two word line gate stacks in a MOS DRAM memory circuit. A thin landing pad is formed of conducting material in the open space extending to the source/drain region and over the tops of the gate stacks. An insulating layer is formed over the gate stacks and the landing pad. A recess is etched down through the insulating layer to expose an annular portion of the landing pad. A volume of the insulating material is left upon the landing pad in the open space. A conductive layer is deposited in the recess making contact with the exposed annular portion of the landing pad. A dry etching process is used to remove a segment of the conductive layer formed over the volume of insulating material upon the landing pad, after which the volume of insulating material upon the landing pad is removed. Remaining is a storage node made upon of a continuous layer of conductive material that lines the recess and the open space. A dielectric layer and a cell plate are in one embodiment formed over the continuous layer of conducting material so as to extend down into the open space, thus completing a container capacitor.

26 Claims, 4 Drawing Sheets

CONTAINER CAPACITOR

This is a divisional application of U.S. Ser. No. 08/818,597, filed on Mar. 14, 1997 now U.S. Pat. No. 5,786,250 which is incorporated herein by reference.

BACKGROUND OF THE INVENTION

1. The Field of the Invention

The present invention relates to methods of forming a conductive structure over a charge conducting region. More particularly, the present invention relates to methods of forming a vertically oriented structure composed of conductive material projecting from a charge conducting region. The method of the present invention is particularly useful for forming a capacitor storage node between two gate stacks situated on a semiconductor substrate.

2. The Relevant Technology

Integrated circuits provide the logic and memory of computers and other intelligent electronic products. These tiny chips have advanced in capability to a level that has made the computers and other intelligent electronic devices in which the integrated circuits operate highly functional. Integrated circuits are also being manufactured economically, allowing the highly functional computers and other intelligent electronic products to be provided to consumers at an affordable cost.

Integrated circuits are currently manufactured by an elaborate process in which semiconductor devices, insulating films, and patterned conducting films are sequentially constructed in a predetermined arrangement on a semiconductor substrate. In the context of this document, the term "semiconductor substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term "substrate" refers to any supporting structure including but not limited to the semiconductor substrates described above. The conventional semiconductor devices which are formed on the semiconductor wafer include capacitors, resistors, transistors, diodes, and the like. In advanced manufacturing of integrated circuits, hundreds of thousands of these semiconductor devices are formed on a single semiconductor substrate.

The computer and electronics industry is constantly under market demand to increase the speed at which integrated circuits operate, to increase the capabilities of integrated circuits, and to reduce the cost of integrated circuits. One manner of accomplishing this task is to increase the density with which the semiconductor devices can be formed on a given surface area of a single semiconductor wafer. In so doing, the semiconductor devices must be decreased in dimension in a process known as miniaturization. In order to meet market demands and further the miniaturization of integrated circuits, the processes by which the semiconductor devices are formed are in need of improvement. The challenge in miniaturizing integrated circuits is to do so without greatly increasing the cost of the processes by which integrated circuits are manufactured. Accordingly, the new processes must also be relatively simple and cost effective.

One structure which is frequently formed in integrated circuit manufacturing and for which improved methods of formation are needed is the capacitor. The capacitor is formed with a storage node, a cell plate, and an intervening dielectric layer. The storage node and the cell plate are typically patterned out of polysilicon by conventional photolithography and dry etching. The dielectric layer is formed in an intervening process between the formation of the storage node and the cell plate, typically by growth of silicon dioxide through exposure of the polysilicon of the storage node to oxygen at an elevated temperature.

An important consideration in forming capacitors in integrated circuits is surface area. A large surface area of the storage node and cell plate is necessary in order to provide high capacitance and therefore optimal performance of the capacitor. Balanced against this need is the competing requirement that the capacitor also occupy a minimum of space on the semiconductor substrate on which the capacitor is formed. One manner in which the semiconductor industry has approached minimal space capacitor formation is to form the capacitor at a significant distance above the semiconductor substrate. When so doing, one of the storage node and the cell plate are typically wrapped around the other, forming what is known as a stacked capacitor.

The use of container capacitors has effectively increased capacitor surface area, but the formation of container capacitors presents new problems. One such problem involves making electrical contact between the container capacitor and an underlying source/drain region through a relatively narrow area between two gate stacks. One example of the occurrence of such a problem is in the formation of a metal oxide silicon dynamic random access memory (MOS DRAM) cell, where a container capacitor is formed above two word line gate stacks.

Shown in FIG. 1 is a typical arrangement of the basic structure used in the formation of a MOS DRAM memory cell. Shown therein is semiconductor structure 10 formed with a silicon substrate 12 on which are located a plurality of source/drain regions 12a. A pair of gate stacks, generally seen at reference numeral 14, serve as word lines and provide control signals to the memory cell. Gate stacks 14 are situated on silicon substrate 12, one gate stack 14 at either side of the center source/drain region 12a. Each gate stack 14 is provided at the top and sides thereof with a protective silicon nitride spacer 14a. Miniaturization demands require that gate stacks 14 be closely spaced. Thus a relatively narrow open space 16 is defined between gate stacks 14 and over the center source/drain region 12a.

Typically in the formation of a container capacitor, a storage node is formed above source/drain region 12a projecting upwards therefrom for a distance above gate stacks 14. To form the storage node, a layer of insulating material such as a borophosphosilicate glass (BPSG) layer is formed over gate stacks 14 and source/drain region 12a therebetween. Open space 16, seen in FIG. 1, is then etched into the BPSG layer in which to form the container capacitor. Open space 16 extends from the top most surface of the BPSG layer down to source/drain region 12a in between gate stacks 14. Once formed, the storage node will be situated upon source/drain region 12a in between gate stacks 14.

Problems arise in removing BPSG material to form open space 16 which is typically narrower than about 0.2 microns, a distance not readily achievable with conventional photolithography resolution. Therefore, in order to form open space 16, the BPSG layer must be patterned such that the subsequent etch of the BPSG layer creates an opening above open space 16 that is wider than open space 16. If the etch of the BPSG layer is selective to silicon nitride cap 14a, the etch form open space 16 such that it is self-aligned between gate stacks 14. Self-alignment ensures that, if the etched opening above open space 16 is slightly misplaced in initial alignment between gate stacks 14 and the source/drain region 12a therebetween, open space 16 will still be situated between gate stack 14 so as to expose source/drain region 12a therebetween.

Conventional self-alignment processes have several drawbacks which are advantageous to avoid. For instance, a dry etching process such as reactive ion etching (RIE) or milling RIE (MRIE) is typically used to form the opening to open space 16, and must also clear BPSG material from open space 16. In so doing, it is difficult to terminate the dry etching without etching into the silicon of source/drain region 12a between gate stacks 14. It is also difficult to maintain a uniformity of the dry etching process across the entirety of semiconductor structure 10 when etching into multiple open spaces 16 situated across semiconductor structure 10, such that all open spaces 16 are fully cleared of BPSG material without etching into respective source/drain regions 12a.

Thus, the etching must clear BPSG material to form open space 16 without substantially etching the silicon of silicon substrate 12 where source/drain region 12a is situated. As discussed, such a selective etch is difficult to conduct, and the consequences of over-etching are severe, as etching into source/drain region 12a causes shorting and results in a defective condition of the entire integrated circuit.

Further problems arise in forming a container capacitor once open space 16 has been cleared of BPSG. One such problem occurs when depositing a capacitor storage node in the completed opening. When so doing, the material of the capacitor storage node tends to coalesce into the center of open space 16 so as to fill up much of open space 16, and thus making open space 16 largely inaccessible for the formation of the container capacitor therein.

One prior art process directed to remedying these problems utilizes a landing pad formed in open space 16. One common manner of utilizing a landing pad in container capacitor formation is shown in FIG. 2 and comprises forming the landing pad from a polysilicon plug 24 that fills open space 16. Polysilicon plug 24 eliminates the need for selectively etching BPSG material to form open space 16. The formation of polysilicon plug 24 is problematic in that it consumes fabrication time to deposit, and due to the thickness thereof. Also, polysilicon plug 24 fills the entirety of open space 16, thus preventing the formation of the container capacitor therein and consequently reducing the density within which the container capacitor cell can be formed.

Forming a landing pad only in a bottom portion of open space 16 has also been attempted, but has proven difficult, as the landing pad is time consuming to form and still must be sufficiently thick to compensate for non-uniformity in etching across semiconductor wafer 10. Also, the landing pad, although only in a bottom portion of open space 16, still consumes much of open space 16.

Consequently, an improved method is needed that overcomes the above-discussed problems inherent to forming a conductive structure in a narrow space above a source/drain region. Such a method would preferably form a landing pad in a manner that also overcomes the above-discussed problems of the prior art landing pads, including fabrication time, and the inherent low density in which a container capacitor can be formed. In addition, such a method is needed that can be conducted in a simple and cost effective manner.

SUMMARY OF THE INVENTION

The present invention resolves the above-described problems by providing an improved method of using a landing pad to form a vertically oriented structure in an open space above a charge conducting region.

In one embodiment of the method of the present invention where the vertically oriented structure comprises a storage node of a container capacitor, a charge conducting region in the form of a source/drain region is initially provided on a semiconductor substrate. Also provided on the semiconductor substrate is a pair of gate stacks that are located one to either side of the source/drain region. The gate stacks are closely spaced such that an open space is formed between the gate stacks and over the source/drain region. The open space preferably has a width of about 0.1 microns.

A layer of a conductive material is subsequently deposited in the open space and upon the source/drain region. A landing pad is patterned and etched from the layer of conductive material so as to line the sides and bottom of the open space, but not so as to substantially fill the open space. The landing pad also extends over at least a portion of the top of each gate stack.

Once the landing pad is formed, a layer of insulating material, such as a BPSG layer, is subsequently formed over the landing pad. The BPSG layer is formed with a height corresponding to the intended height of the capacitor storage node to be formed. A recess is then anisotropically etched wider than the open space through the BPSG layer to terminate at and expose a portion of the landing pad located on the tops of the gate stacks. A volume of BPSG is left remaining on the landing pad within the open space between the pair of gate stacks.

Next, a polysilicon layer or other layer of conductive material is deposited so as to line and partially fill the recess. The polysilicon layer preferably makes an annular region of contact with the exposed surface on the landing pad. A segment of the polysilicon layer also covers the volume of BPSG on the landing pad.

After depositing the polysilicon layer, an anisotropic etching process is conducted to remove the segment of the polysilicon layer covering the volume of BPSG on the landing pad. The isotropic etching process preferably may be a dry etch. The volume of BPSG on the landing pad is exposed as a result of the anisotropic etching process. The landing pad and polysilicon layer at this point form a continuous conductive layer around the recess and the open space and containing the volume of BPSG on the landing pad.

In an optional further procedure, the volume of BPSG on the landing pad is removed so as to expose the portion of the landing pad that extends into the recess between the pair of gate stacks such that the recess extends down below the tops of the gate stacks. Removing the volume of BPSG on the landing pad increases the surface area of the resulting capacitor that can be formed thereby, and consequently increases the capacitor charge retention and refresh rates thereof. A further optional procedure comprises roughening the surface of the landing pad and polysilicon layer to increase the surface area thereof. In one embodiment, roughening of the surface of the landing pad and the polysilicon layer is achieved through formation of a layer of hemispherical grained (HSG) polysilicon or cylindrical grained polysilicon (CGP) on exposed surfaces of the landing pad and the polysilicon layer.

The landing pad and the polysilicon layer line the open space and the recess, which together in one embodiment form a capacitor storage node. A capacitor incorporating the capacitor storage node is completed by forming a dielectric layer in the recess and the open space, after which a cell plate is formed thereover. The cell plate is preferably formed of polysilicon.

In an alternate embodiment, the BPSG layer is partially reduced in height concurrent with a substantially total removal of the volume of BPSG on the landing pad. Reducing the height of the BPSG layer exposes the entire circumference of a top portion of the polysilicon layer and allows a capacitor dielectric and cell plate to be formed on both sides thereof, further increasing capacitor surface area.

The method of the present invention as described above forms a container capacitor in a simplified manner and without the need for a dry etching process that is highly selective to the silicon of the source/drain region. Also, the capacitor surface area increases in that the resulting capacitor extends into the open space. Densification and miniaturization are facilitated by greater capacitor surface area being formed in a smaller foot print on the semiconductor wafer. The landing pad is also thinner than prior art landing pads, such as polysilicon plug 24 discussed above, thus saving process time in the deposition thereof and thereby increasing integrated circuit manufacturing throughput.

These and other features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained will be understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
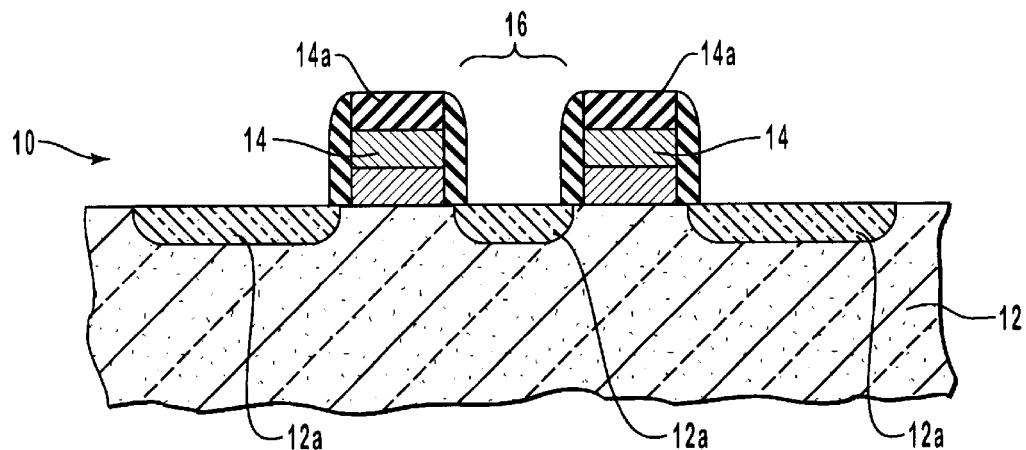
FIG. 1 is cross-sectional view of a semiconductor structure showing an initial step of a method of the present invention in which a pair of gate stacks are formed adjacent to and above a source/drain region of a silicon substrate defining therebetween an open space.
Figure 2:
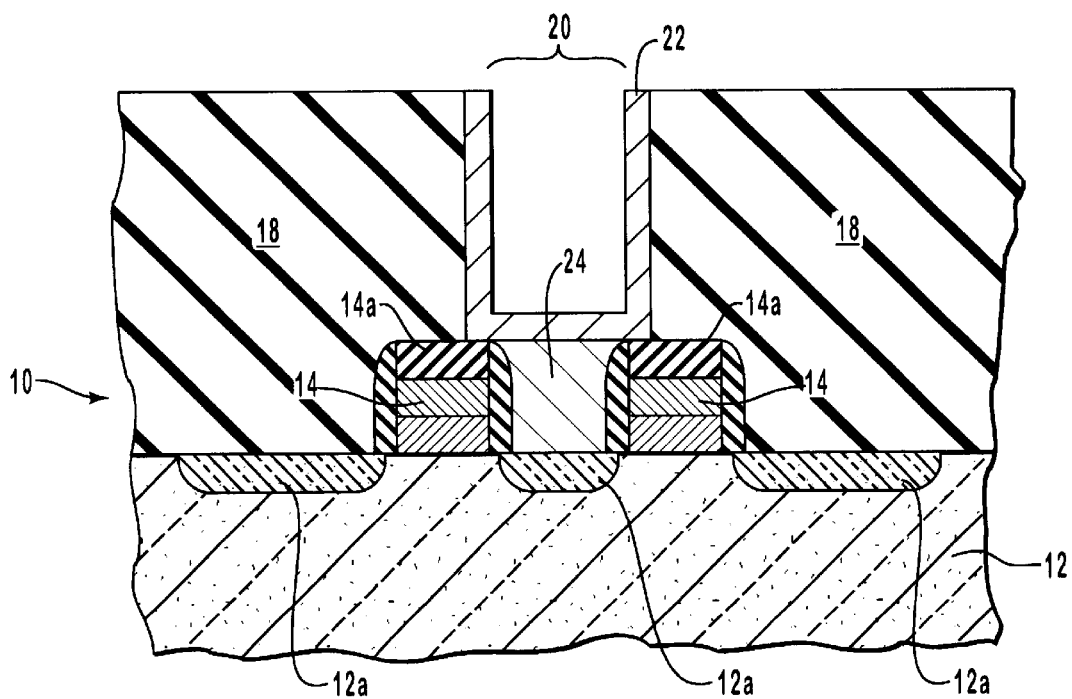
FIG. 2 is a cross-sectional view of the semiconductor structure of FIG. 1, showing a polysilicon plug being used as a landing pad in one prior art method of forming a capacitor storage node.

One manner of conducting the method of the present invention is illustrated in FIGS. 1 and 3–8. The method of the present invention may be used to form a container capacitor in a MOS DRAM cell. Shown in FIG. 1, semiconductor structure 10 is a silicon wafer, however, any suitable type of semiconductor substrate may be used such as silicon on insulator (SOI), silicon on sapphire (SOS) and the like. Semiconductor structure 10 is formed with a silicon substrate 12 on which is situated a plurality of charge conducting regions shown in FIG. 1 as source/drain regions 12a. A pair of gate stacks 14 are formed on silicon substrate 12 with a source/drain region 12a therebetween. Each gate stack 14 is provided at the top and side thereof with a protective spacer. The protective spacer is preferably composed of silicon dioxide or silicon nitride. In the depicted embodiment, the protective spacers are shown as silicon nitride spacers 14a.

Gate stacks 14 define therebetween an open space 16 over source/drain region 12a. Open space 16 is preferably less than about 0.2 microns wide, and in the depicted embodiment has a width of about 0.1 microns wide. Of course open space 16 could be formed in other embodiments over other types of charge conducting regions and between adjoining structures other than gate stacks 14.

Figure 3:
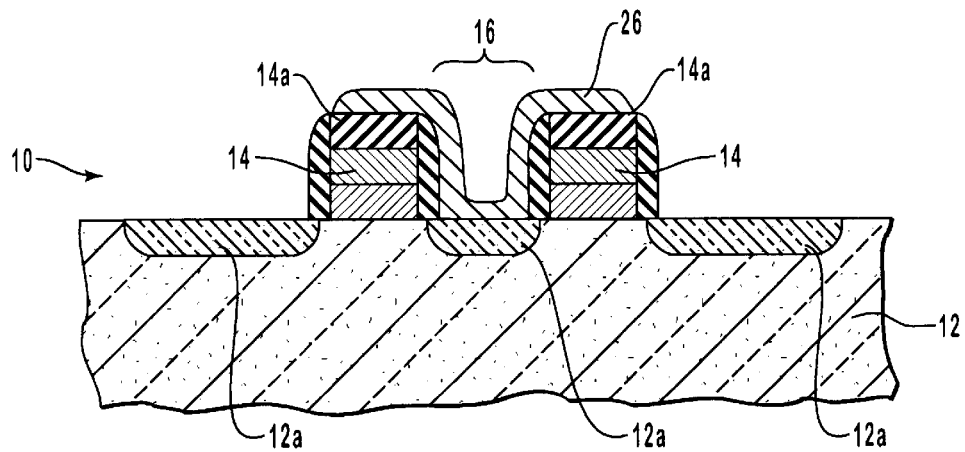
FIG. 3 is a cross-sectional view of the semiconductor structure of FIG. 1, showing a step of a method of the present invention in which a landing pad is formed in an open space of FIG. 1 over and between the pair of gate stacks, and above the source/drain region between the pair of gate stacks.

FIG. 3 illustrates a landing pad 26 formed in open space 16 so as to line the side and bottom of open space 16 and to extend over the top of each gate stack 14. Landing pad 26 is composed of a layer of conductive material such as aluminum, tungsten, titanium, titanium silicide, or polysilicon. In the depicted embodiment, the layer of conductive material comprises polysilicon, and is deposited with a chemical vapor deposition (CVD) process. The thickness of landing pad 26 is dependent on the width of open space 16 and the selectivity to the conductive material of a subsequent anisotropic etching process that is to be conducted. It is preferred that landing pad 26 have a thickness that does not result in landing pad 26 occupying the entirety of open space 16. Where open space 16 has a width of about 0.1 microns, the thickness of landing pad 26 is in a range from about 50 Å to about 600 Å, preferably from about 100 Å to about 500 Å, and more preferably from about 200 Å to about 400 Å.

FIG. 3 shows the result of the layer of conductive material being patterned and etched so as to form the depicted landing pad 26, which covers the bottom and wall of open space 16 upon gate stacks 14, as well as at least a portion of the tops of gate stacks 14. Patterning of the layer of conductive material can be accomplished with any conventional method.

Figure 4:
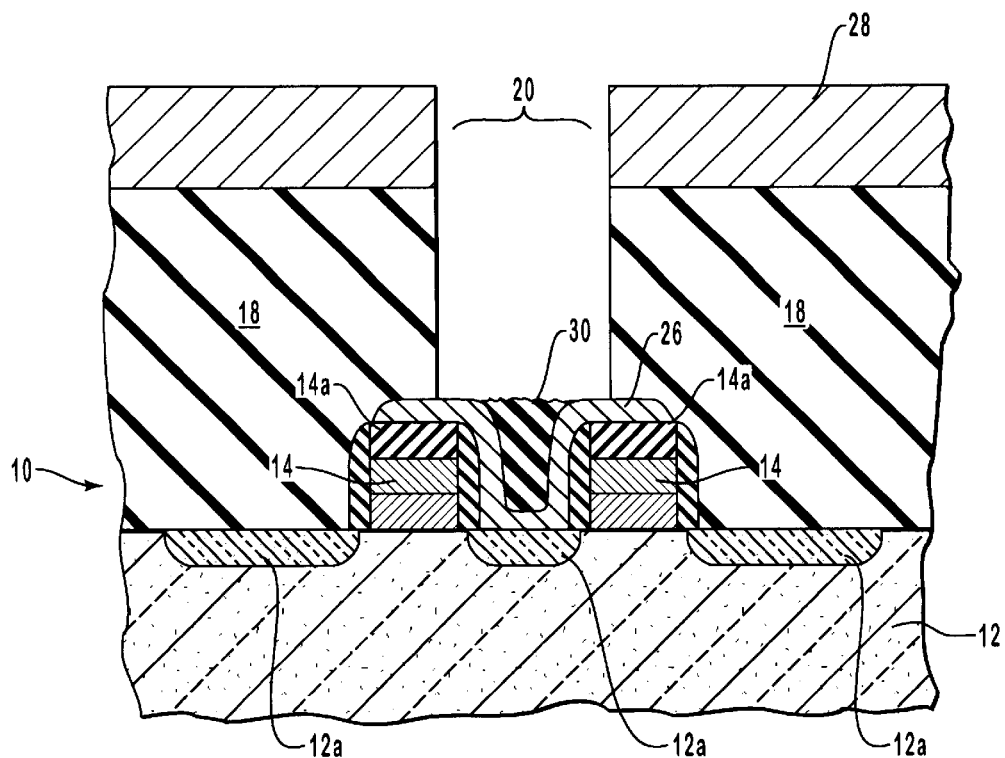
FIG. 4 is a cross-sectional view of the semiconductor structure of FIG. 3, showing further steps of the method of the present invention in which a BPSG layer is formed above the landing pad of FIG. 3 and in which a recess is etched through the BPSG layer down to expose the landing pad.

After landing pad 26 is formed, a layer of insulating material is formed over landing pad 26 as shown in FIG. 4. The layer of insulating material is preferably deposited as a blanket layer over the entirety of semiconductor structure 10. Suitable materials for forming the layer of insulating material include phosphosilicate glass (PSG) and borophosphosilicate glass (BPSG). In the depicted embodiment, the layer of insulating material comprises a BPSG layer 18. BPSG layer 18 is formed with a height corresponding to the desired resulting height of the capacitor storage node to be formed.

Once BPSG layer 18 is formed, a recess 20 is formed in BPSG layer 18 above landing pad 26. Recess 20 is preferably formed with the use of a photoresist mask 28 and an anisotropic etching process. More preferably, the anisotropic etching process is a dry etching process such as RIE or MRIE. Recess 20 is also preferably formed with a width of at least about 0.2 microns and is anisotropically etched with sufficient depth to expose a portion of landing pad 26 as shown in FIG. 4. The exposed portion of landing pad 26 is preferably annular in shape and located above the tops of gate stacks 14. Etching recess 20 so as to stop on landing pad 26 leaves a volume of BPSG 30 on landing pad 26 and in the center of open space 16.

Recess 20 is wider than open space 16. The surface of BPSG layer 18 defining recess 20 is located over gate stacks 14. Consequently, if the etch forming recess 20 is slightly misaligned, open space 16 will still be situated under recess 20, recess 20 will have a misalignment margin of error that extends to the lateral edges of landing pad 26 on top of gate stacks 14, and the wall of recess 20 will still be located over gate stacks 14, although the wall of recess 20 may not be symmetrical about open space 16.

Figure 5:
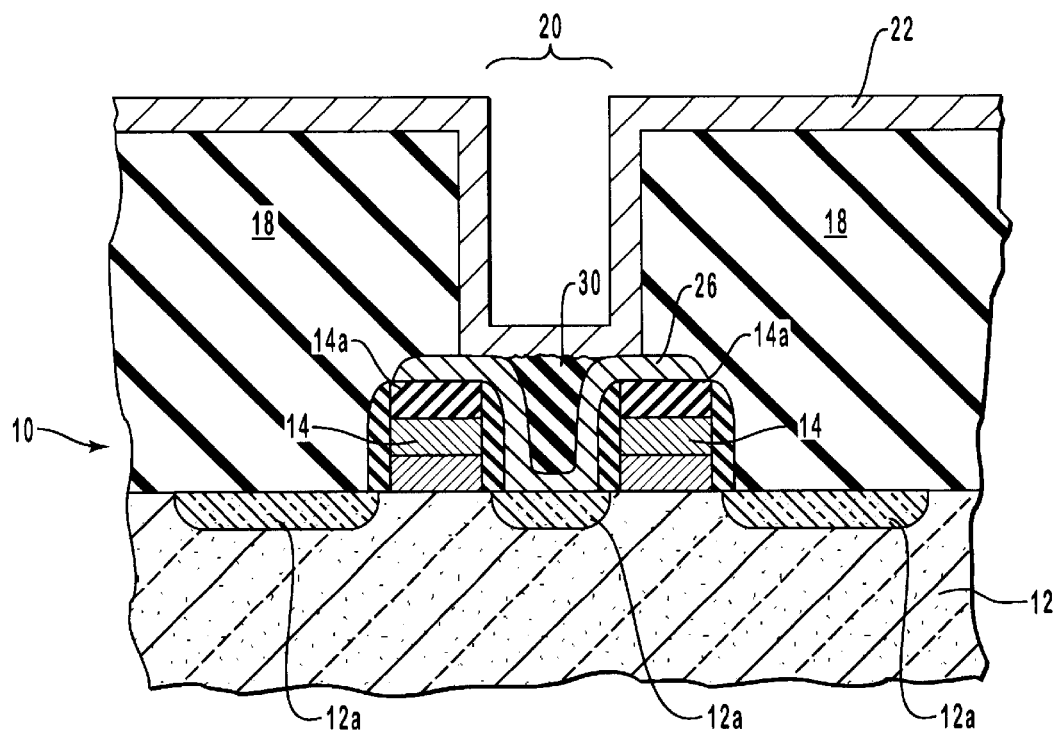
FIG. 5 is a cross-sectional view of the semiconductor structure of FIG. 4, showing a further step of the method of the present invention in which a polysilicon layer is formed in the recess and upon BPSG material that is upon the landing pad.

As shown in FIG. 5, photoresist mask 28 is removed and a second layer of conductive material is deposited in recess 20. The second layer of conductive material can be of any suitable type of conductive material and is preferably one of the conductive materials listed above for use in forming landing pad 26. In the depicted embodiment, the second layer of conductive material is a polysilicon layer 22. Polysilicon layer 22 lines the wall of recess 20 and also contacts the exposed portion of landing pad 26. A segment of polysilicon layer 22 also covers volume of BPSG 30. Volume of BPSG 30 is thereby encapsulated by landing pad 26 and polysilicon layer 22. Preferably, polysilicon layer 22 is deposited with CVD in the same manner as discussed above for landing pad 26. Polysilicon layer 22 is deposited with a thickness corresponding to a desired thickness of a capacitor storage node being formed and in the depicted embodiment has a thickness of about 300 Angstroms.

Figure 6:
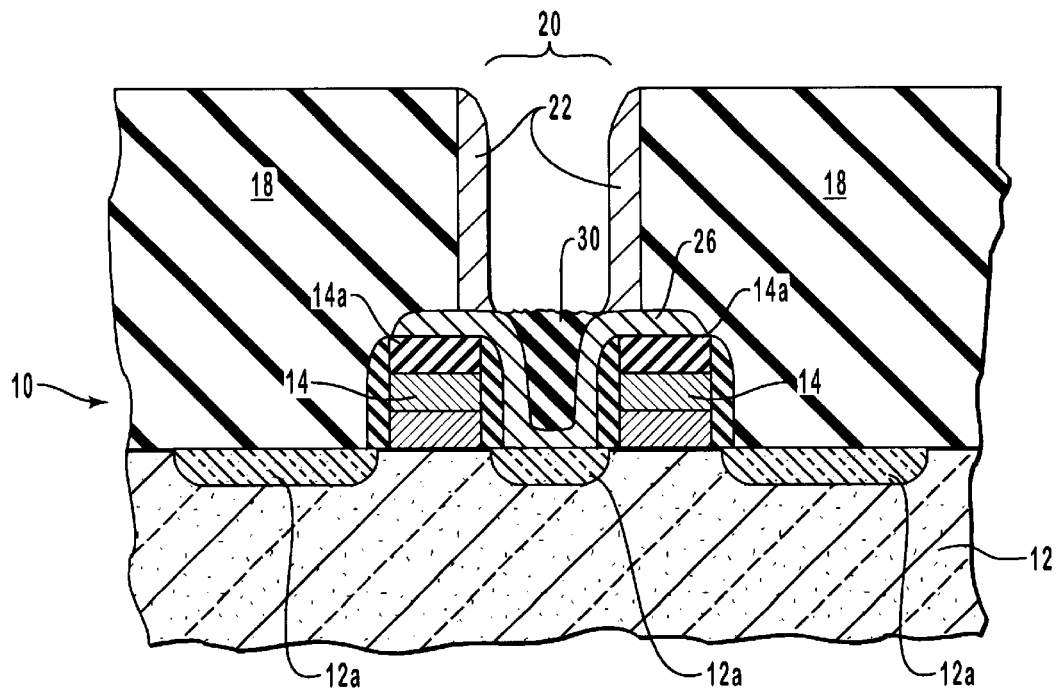
FIG. 6 is a cross-sectional view of the semiconductor structure of FIG. 5, showing a further step of the method of the present invention in which a portion of he polysilicon layer that is upon the BPSG material that is upon the landing pad is etched to expose the BPSG material upon the landing pad.

As shown in FIG. 6, once polysilicon layer 22 is deposited, an anisotropic etching process is then conducted to remove the segment of polysilicon layer 22 that covers volume of BPSG 30. The etch removes substantially all horizontally exposed portions of polysilicon layer 22. Volume of BPSG 30 is exposed as a result of the anisotropic etching process. Together, landing pad 26 and polysilicon layer 22 form a wall of conducting material that lines the circumference of open space 16 and recess 20, while volume of BPSG 30 is located in the center thereof. The wall of conducting material in the depicted embodiment serves as a capacitor storage node.

Figure 7:
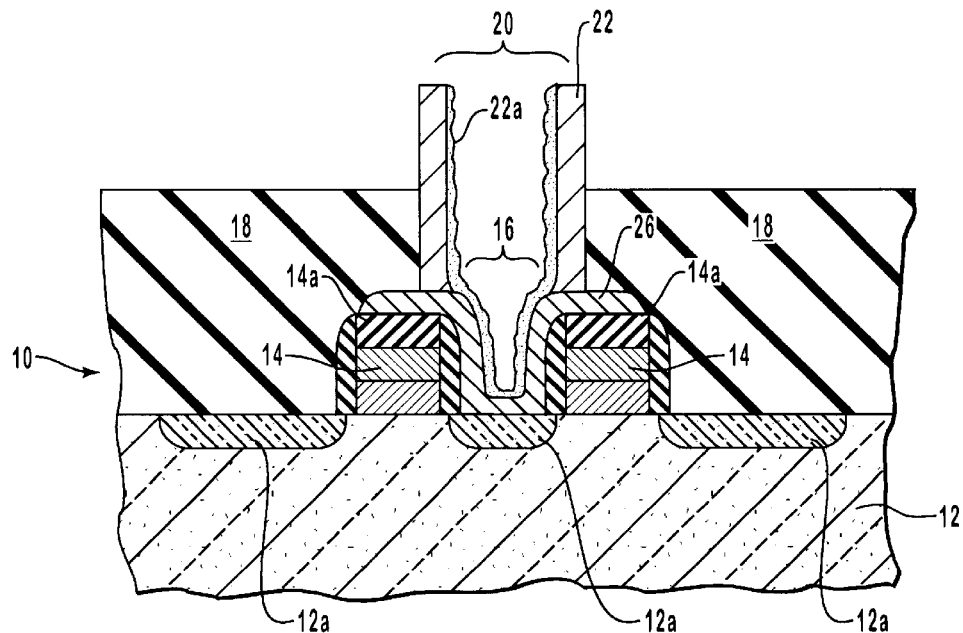
FIG. 7 is a cross-sectional view of the semiconductor structure of FIG. 6, showing further steps of the method of the present invention in which the BPSG material upon the landing pad is removed, and in which an HSG polysilicon layer is deposited on a surface of the landing pad and the polysilicon layer, wherein the polysilicon layer and the landing pad together form a storage node.

As shown in FIG. 7, once exposed, volume of BPSG 30 is preferably removed in 26 order to extend recess 20 into open space 16. The removal of volume of BPSG 30 is preferably conducted with an etching process using an etchant that is substantially composed of an etch recipe that is selective to BPSG over polysilicon. It can be appreciated that one of ordinary skill in the art will be able to select preferred materials for a specific application of the inventive method and will be able to formulate an etch recipe that is selective to the dielectric over the electrically conductive material.

As a result of the removal volume of BPSG 30, the capacitor storage node comprised of polysilicon layer 22 and landing pad 26 extends into open space 16, below the tops of gate stacks 14. The surface area of the capacitor storage node and thus the resulting charge retention and the time availability between refreshes of a capacitor incorporating the capacitor storage node are thereby increased. Providing the increased charge retention and the longer time availability between refreshes without increasing the amount of surface space occupied by the capacitor on silicon substrate 12 assists in densification and miniaturization of the integrated circuit.

In further optional steps, shown in FIG. 7, the exposed surfaces of landing pad 26 and polysilicon layer 22 are roughened to further increase the surface area of the capacitor storage node formed by polysilicon layer 22 and landing pad 26. The roughening of the exposed surfaces of polysilicon layer 22 and landing pad 26 is preferably achieved by depositing a granular material thereon, such as through the formation of a layer of HSG polysilicon or CGP. In the depicted embodiment, a layer of HSG polysilicon 22a is formed. Layer of HSG polysilicon 22a is preferably deposited conventionally with a CVD process. Roughening comprises depositing a thin undoped or lightly doped layer of amorphous silicon over polysilicon layer 22 and subjecting the layer of amorphous silicon to high pressure and temperature. The high pressure and temperature result in a nucleation of amorphous silicon into discrete grains. An HSG grain size is described as one that is substantially in a range from about 100 Å to about 2,500 Å, preferably from about 200 Å to about 1,000 Å, and most preferably from about 200 Å to about 500 Å.

Figure 8:
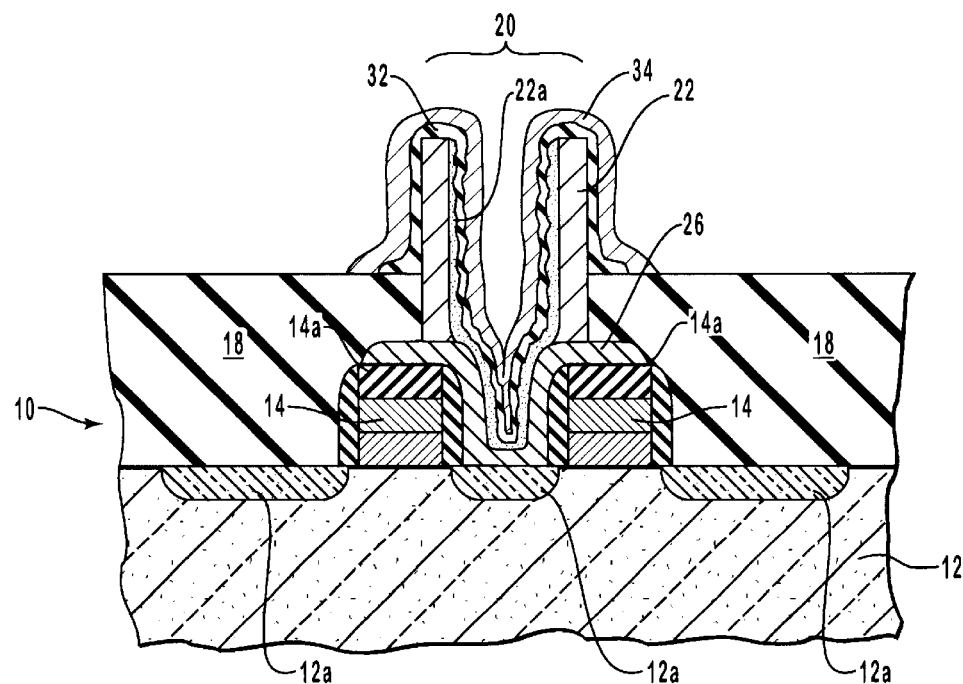
FIG. 8 is a cross-sectional view of the semiconductor structure of FIG. 7, showing further steps of the method of the present invention in which a dielectric layer is formed over the storage node and a cell plate is formed over the dielectric layer to complete a container capacitor.

Further steps used in completing a container capacitor are shown in FIG. 8. As shown therein, a dielectric layer 32 is formed in recess 20 over the storage node formed by polysilicon layer 22, HSG polysilicon 22a, and landing pad 26. Dielectric layer 32 is formed of silicon nitride or barium strontium titanate, and the like, preferably silicon nitride. After the formation of dielectric layer 32, a cell plate 34 is conventionally formed over dielectric layer 32. Cell plate 34 is preferably composed of polysilicon. Because the center of open space 16 has been cleared of BPSG, dielectric layer 32 and cell plate 34 fully extend into and fill open space 16. This increased area increases the capacitor surface area density (i.e. surface area of capacitor divided by lateral area thereof occupying a position upon the semiconductor structure) within which the container capacitor can be formed on semiconductor structure 10.

When dielectric layer 32 and cell plate 34 are formed over the capacitor storage node as discussed above, dielectric layer 32 and cell plate 34 are formed on two opposing sides of the wall of the charge conducting material that forms the capacitor storage node. The surface area of the resulting container capacitor is thereby even further increased compared to that of the first embodiment.

From the foregoing disclosure, it can be seen that the present invention provides a method of forming a container capacitor storage node in a simplified manner and without the need for a dry etch of high selectivity to the silicon of the source/drain region. Also, as the open space between the gate stacks is fully available for formation of the capacitor storage node, the resulting container capacitor has increased surface area. Densification and miniaturization of the resulting integrated circuit are thereby facilitated. The polysilicon of the landing pad is also thinner than the prior art landing pad, saving process time in the deposition thereof and thereby increasing integrated circuit manufacturing throughput. The method of the present invention is thus simple and cost effective.

In reference to FIG. 8, the present invention provides a DRAM storage node that includes a first electrically conductive material such as landing pad 26 disposed substantially conformably upon a semiconductor substrate topography such as semiconductor structure 10 that may include two raised structures such as gate stacks 14 resting upon semiconductor substrate 12. The two raised structures may have a semiconductor active area such as semiconductor active area 12a disposed therebetween. The DRAM storage node has a first dielectric film such as BPSG layer 18 that is disposed upon the semiconductor substrate topography. The first dielectric film has a recess such as recess 20 therein substantially above the active area. The DRAM storage node also has a second electrically conductive material such as polysilicon layer 22 disposed within the recess and upon the first electrically conductive material. The second electrically conductive material substantially forms an open cylinder that makes electrical contact with the first electrically conductive material. It can be seen that in a DRAM storage node of the present invention, the first electrically conductive material is substantially symmetrical around a single axis to form a horn, bell, or flanged parabola shape. The DRAM storage node may also include a second dielectric film such as dielectric layer 32 disposed substantially conformably upon the second electrically conductive material and a third electrically conductive material such as cell plate 34 disposed substantially conformably upon the second dielectric film.

When incorporating a roughened electrically conductive layer such as HSG polysilicon 22a, the DRAM storage node may be described as including a third electrically conductive material 22a disposed within the recess and substantially covering surfaces of first 26 and second 22 electrically conductive material that are within recess 20. Thus, the second dielectric film 32 that is disposed substantially conformably upon the third electrically conductive material 22a is the cell dielectric between third electrically conductive material 22a fourth electrically conductive material 34.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A charge storage device comprising: a landing pad structure of a first electrically conductive material disposed conformably upon a semiconductor substrate topography, said semiconductor substrate topography including a planar surface and two raised structures extending therefrom, and a semiconductor active area disposed therebetween, said landing pad structure having a top portion that terminates at a peripheral boundary that is disposed upon a topmost surface of each of said two raised structures;

a first dielectric film disposed upon said semiconductor substrate topography and upon a portion of said landing pad structure, said first dielectric film having a recess therein above said active area, said recess comprising an open space between said two raised structures, wherein said open space is narrower than said recess, said open space being defined by lateral walls that extend down to a bottom on said semiconductor substrate topography, and such that said landing pad structure extends upon the bottom and lateral walls of said open space without filling completely said open space, wherein the recess in the first dielectric film has a width of no greater than about 0.2 microns; and a projecting structure of a second electrically conductive material extending from within said recess and projecting from an interface with the top portion of said landing pad structure inside the peripheral boundary thereof, wherein said projecting structure is in contact with said first dielectric film, and such that a portion of said landing pad structure that is situated upon said raised structures extends beyond said interface between said projecting structure and said landing pad structure.

2. The charge storage device according to claim 1, wherein said projecting structure projects symmetrically about an axis from said interface with the top portion of the landing pad structure.

3. The charge storage device according to claim 1, further comprising:

a second dielectric film disposed conformably upon said projecting structure and upon the portion of said landing pad structure that is within said open space, wherein the portions of said landing pad structure and said second dielectric film that are within said open space do not completely fill said open space; and a third electrically conductive material disposed conformably upon said second dielectric film.

4. The charge storage device according to claim 1, wherein said projecting structure forms an open cylinder.

5. The charge storage device according to claim 1, further comprising:

a layer of polysilicon having a grain size that is in a range from about 100 Å to about 2,500 Å on the protruding structure and on the landing pad structure within the recess situated between the two raised structures.

6. The charge storage device according to claim 1, wherein the first electrically conductive material comprises a material selected from a group consisting of aluminum, tungsten, titanium, titanium silicide, and polysilicon, and wherein the second electrically conductive material comprises polysilicon.

7. The charge storage device according to claim 1, wherein:

the two raised structures comprise a pair of gate stacks formed on said planar surface that extend from the planar surface of the semiconductor substrate topography to the same distance, one of the pair of gate stacks is located on one side of the semiconductor active area, and the other of the pair of gate stacks is located on another side of the semiconductor active area, each gate stack is formed with a cap of insulating material at the top thereof and extends from said planar surface to the topmost surface; and the topmost surface of one gate stack is offset from the planar surface by the same distance as the topmost surface of the other gate stack.

8. The charge storage device according to claim 1, wherein said first electrically conducting material has a thickness selected to not occupy the entirety of said open space and said second electrically conducting material has a thickness selected optimized for the performance of the charge storage device.

9. The charge storage device according to claim 1, further comprising:
   a third electrically conductive material disposed within said recess and within said open space, and covering surfaces of said landing pad structure and said projecting structure that are within said recess and within said open space;
   a second dielectric film disposed conformably upon said third electrically conductive material, wherein the portions of said landing pad structure, said third electrically conductive material, and said second dielectric film that are within said open space do not completely fill said open space; and
   a fourth electrically conductive material disposed conformably upon said second dielectric film.

10. The charge storage device according to claim 9, wherein the third electrically conductive material comprises HSG polysilicon.

11. A charge storage device comprising:
   a landing pad structure of a first electrically conductive material disposed conformably upon a semiconductor substrate topography and symmetrically about an axis, said semiconductor substrate topography including a planar surface and two raised structures that extend therefrom to the same distance and a semiconductor active area disposed therebetween, said landing pad structure having a top portion that terminates at a peripheral boundary that is disposed upon a topmost surface of each of said two raised structures;
   a first dielectric film disposed upon said semiconductor substrate topography and upon a portion of said larding pad structure, said first dielectric film having a recess therein above said active area, said recess comprising an open space between said two raised structures, wherein said open space is narrower than said recess, said open space being defined by lateral walls that extend down to a bottom on said semiconductor substrate topography, and such that said landing pad structure extends upon the bottom and lateral walls of said open space without filling completely said open space, wherein the recess in the first dielectric film has a width of no greater than about 0.2 microns;
   a projecting structure of a second electrically conductive material extending from within said recess and projecting from an interface with the top portion of said landing pad structure inside the peripheral boundary thereof, said projecting structure forming an open cylinder, wherein said projecting structure is in contact with said first dielectric film, and such that a portion of said landing pad structure that is situated upon said raised structures extends beyond said interface between said projecting structure and said landing pad structure;
   a second dielectric film disposed conformably upon said projecting structure and upon the portion of said landing pad structure that extends upon the bottom and lateral walls of said open space, wherein the portions of said second dielectric film and of said landing pad structure that are within said open space do not completely fill said open space; and a third electrically conductive material disposed conformably upon said second dielectric film.

12. A charge storage device comprising:
   a landing pad structure of a first electrically conductive material disposed conformably upon a semiconductor substrate topography and symmetrically about an axis, said semiconductor substrate topography including a planar surface and two raised structures that extend therefrom to the same distance and a semiconductor active area disposed therebetween, said landing pad structure having a top portion that terminates at a peripheral boundary that is disposed upon a topmost surface of each of said two raised structures;
   a first dielectric film disposed upon said semiconductor substrate topography and upon a portion of said landing pad structure, said first dielectric film having a recess therein above said active area, said recess comprising an open space between said two raised structures, wherein said recess has a width of at least 0.2 microns and said open space has a width of no greater than about 0.2 microns, said open space being defined by lateral walls that extend down to a bottom on said semiconductor substrate topography, and such that said landing pad structure extends upon the bottom and lateral walls of said open space without filling completely said open space;
   a projecting structure of a second electrically conductive material extending from within said recess and projecting from an interface with the top portion of said landing pad structure inside the peripheral boundary thereof, said projecting structure forming an open cylinder, wherein said projecting structure is in contact with said first dielectric film, and such that a portion of said landing pad structure that is situated upon said raised structures extends beyond said interface between said projecting structure and said landing pad structure;
   a third electrically conductive material disposed within said recess and said open space, and covering surfaces of said landing pad structure and said projecting structure that are within said recess and within said open space without completely filling said open space;
   a second dielectric film disposed conformably upon said third electrically conductive material within said recess and said open space without completely filling said open space; and
   a fourth electrically conductive material disposed conformably upon said second dielectric film.

13. The charge storage device according to claim 12, wherein said landing pad structure is symmetrical about an axis between the two raised structures.

14. The charge storage device according to claim 12, wherein said projecting structure forms an open cylinder.

15. A charge storage device comprising:
   a landing pad structure of a first electrically conductive material comprising a material selected from a group consisting of aluminum, tungsten, titanium, titanium silicide, and polysilicon and disposed conformably upon a semiconductor substrate topography, said semiconductor substrate topography including a planar surface and two raised structures and a semiconductor active area disposed therebetween, wherein:
      the raised structures extend above the planar surface to the same distance;
      the landing pad structure is symmetrically disposed about an axis between the two raised structures;
      said landing pad structure having a top portion that terminates at a peripheral boundary that is disposed upon a topmost surface of each of said two raised structures;
   a first dielectric film disposed upon said semiconductor substrate topography and upon a portion of said landing pad structure, said first dielectric film having a recess therein above said active area, said recess comprising an open space between said two raised structures, wherein said open space is narrower than said recess, said open space being defined by lateral walls that extend down to a bottom on said semiconductor substrate topography, and such that said landing pad structure extends upon the bottom and lateral walls of said open space without filling completely said open space, wherein the recess in the first dielectric film has a width of no greater than about 0.2 microns;

a projecting structure of a second electrically conductive material extending from within said recess and projecting symmetrically about an axis from an interface with the top portion of said landing pad structure inside the peripheral boundary thereof, wherein said projecting structure is in contact with said first dielectric film, and such that a portion of said landing pad structure that is situated upon said raised structures extends beyond said interface between said projecting structure and said landing pad structure;

a third electrically conductive material comprising polysilicon having a grain size in a range from about 100 Å to about 2,500 Å and disposed within said recess and within said open space and covering surfaces of said landing pad structure and said projecting structure that are within said recess and within said open space;

a second dielectric film disposed conformably upon said third electrically conductive material, wherein the portions of said landing pad structure, said third electrically conductive material, and said second dielectric film that are within said open space do not completely fill said open space; and a fourth electrically conductive material disposed conformably upon said second dielectric film.

16. The charge storage device according to claim 1, wherein said landing pad structure is symmetrical around an axis between the two raised structures.

17. The charge storage device according to claim 15 wherein said projecting structure forms an open cylinder.

18. The charge storage device according to claim 15, wherein the second electrically conductive material comprises polysilicon.

19. The charge storage device according to claim 15, wherein:

the two raised structures comprise a pair of gate stacks formed on said planar surface, one of the pair of gate stacks is located on one side of the semiconductor active area, and the other of the pair of gate stacks is located on another side of the semiconductor active area, each gate stack extends from the planar surface to the topmost surface; and the topmost surface of one gate stack is offset from the planar surface by the same distance as the topmost surface of the other gate stack.

20. An electrical device comprising:

a semiconductor substrate;

a semiconductor active area in the semiconductor substrate;

a pair of gate stacks formed on said semiconductor substrate, one gate stack being located on one side of the semiconductor active area, and the other gate stack being located on another side of the semiconductor active area, and each gate stack being formed with a cap of insulating material at the top thereof, wherein:

the cap of insulating material of one gate stack is offset from the semiconductor substrate by the same distance as the cap of insulating material of the other gate stack; and there is an open space above said semiconductor active area and between the pair of gate stacks;

a landing pad structure of a first electrically conductive material comprising a material selected from a group consisting of aluminum, tungsten, titanium, titanium silicide, and polysilicon and disposed continuously from a peripheral boundary upon a top surface of one gate stack, within said open space, upon the semiconductor active area, and extending to terminate at a peripheral boundary upon a top surface of the other gate stack, such that the portion of said landing pad structure that is within said open space does not completely fill said open space, wherein:

the landing pad structure is symmetrically disposed within the open space about an axis; and said landing pad structure has a top portion that is disposed upon a topmost surface of each of said two gate stacks;

a projecting structure of a second electrically conductive material situated upon and projecting symmetrically about an axis from an interface with the top portion of the landing pad structure inside and between the two peripheral boundaries upon the respective top surfaces of the pair of gate stacks, and such that a portion of said landing pad structure that is situated upon said gate stacks extends beyond said interface between said projecting structure and said landing pad structure;

a third electrically conductive material comprising polysilicon having a grain size in a range from about 100 Å to about 2,500 Å and disposed within said open space and covering surfaces of said landing pad structure and said projecting structure, such that the portions of said landing pad structure and of said third electrically conductive material that are within said open space do not completely fill said open space;

a first dielectric film upon the semiconductor substrate and having a recess therein above said active area therein, wherein the open space, at least a portion of the gate stacks, the first electrically conductive film, and the second electrically conductive film are within the recess, wherein said open space is narrower than said recess, and such that said first dielectric film is in contact with said second electrically conductive film and such that said first dielectric film extends upon a portion of said second electrically conductive film between each of said first and second terminal edges and said interface between said first electrically conductive film and said second electrically conductive film, wherein the recess in the first dielectric film has a width of no greater than about 0.2 microns;

a second dielectric film disposed: in the open space above said semiconductor active area between the pair of gate stacks; and upon said landing pad structure and said projecting structure, such that the portions of said landing pad structure, of said third electrically conductive material, and of said second dielectric film that are within said open space do not completely fill said open space; and a fourth electrically conductive material disposed upon said second dielectric film and extending into said open space.

21. An electrical device comprising:

a semiconductor substrate having an active area therein;

a pair of electrically insulated gate stacks comprising a portion of said semiconductor substrate with said active area, each of said gate stacks being adjacent to and in contact with the active area upon the semiconductor substrate, the pair of gate stacks defining an open space comprised therebetween and above said active area, wherein the portion of semiconductor substrate comprised between said gate stacks including said active area is flat;

a first electrically conductive film extending continuously within said open space from a first terminal edge on top of one gate stack, upon the active area, to terminate at a second terminal edge on top of the other gate stack, such that the portion of said first electrically conductive film that is within said open space does not completely fill said open space;

a second electrically conductive film, situated upon the first electrically conductive film between and inside the first and second terminal edges, extending from an interface with said first electrically conductive film, and projecting away from the semiconductor substrate to terminate above the first electrically conductive film, such that a portion of said first electrically conductive film extends on and in contact with said gate stacks beyond said second electrically conductive film and away from said open space, and such that the portion of said second electrically conductive film that is situated within said open space does not completely fill said open space; and a first dielectric film upon the semiconductor substrate and having a recess therein above said active area therein, wherein the open space, at least a portion of the gate stacks, the first electrically conductive film, and the second electrically conductive film are within the recess, wherein said open space is narrower than said recess, and such that said first dielectric film is in contact with said second electrically conductive film and such that said first dielectric film extends upon a portion of said second electrically conductive film between each of said first and second terminal edges and said interface between said first electrically conductive film and said second electrically conductive film, wherein the recess in the first dielectric film has a width of no greater than about 0.2 microns.

22. The charge storage device according to claim 21, wherein said second electrically conductive film projects symmetrically about an axis above the first electrically conductive film.

23. The electrical device according to claim 21, wherein said second electrically conductive film forms an open cylinder.

24. The electrical device according to claim 21, wherein:

the gate stacks are on opposite sides of the active area;

each gate stack is electrically insulated by a cap of insulating material at the top thereof that extends from a planar surface of the semiconductor substrate to the topmost surface thereof; and each said topmost surface of said gate stacks is offset from the planar surface of the semiconductor substrate by the same distance.

25. The electrical device according to claim 21, further comprising:

a second dielectric film disposed conformably upon said second electrically conductive film, and upon the portion of said first electrically conductive film that is situated within said open space, and such that the portions of said first electrically conductive film and said second dielectric film that are within said open space do not completely fill said open space;

a third electrically conductive material disposed within said recess and within said open space, and covering surfaces of said first and said second electrically conductive films that are within said recess and within said open space, and such that the portions of said first electrically conductive film, said second dielectric film, and said third electrically conductive film that are within said open space do not completely fill said open space; and a fourth electrically conductive material disposed conformably upon said second dielectric film, and extending into said open space.

26. The electrical device according to claim 25, wherein:

the first electrically conductive film comprises a material selected from a group consisting of aluminum, tungsten, titanium, titanium silicide, and polysilicon;

the second electrically conductive film comprises polysilicon; and the third electrically conductive material comprises HSG polysilicon having a grain size that is in a range from about 100 Å to about 2,500 Å.

* * * * *